US012684917B2

(12) United States Patent
Zhang et al.

(10) Patent No.: US 12,684,917 B2
(45) Date of Patent: Jul. 14, 2026

(54) LIGHT EMITTING PANEL, PREPARATION METHOD THEREOF, AND LIGHT EMITTING APPARATUS

(71) Applicant: BOE Technology Group Co., Ltd., Beijing (CN)

(72) Inventors: Can Zhang, Beijing (CN); Ning Cong, Beijing (CN); Xinxin Zhao, Beijing (CN); Minghua Xuan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 433 days.

(21) Appl. No.: 18/274,486

(22) PCT Filed: Aug. 31, 2022

(86) PCT No.: PCT/CN2022/116247

§ 371 (c)(1),
(2) Date: Jul. 27, 2023

(87) PCT Pub. No.: WO2024/045057

PCT Pub. Date: Mar. 7, 2024

(65) Prior Publication Data

US 2024/0429357 A1 Dec. 26, 2024

(51) Int. Cl.
*H10H 20/857* (2025.01)
*H10H 20/01* (2025.01)
*H10W 90/00* (2026.01)

(52) U.S. Cl.
CPC .......... *H10H 20/857* (2025.01); *H10W 90/00* (2026.01); *H10H 20/0364* (2025.01)

(58) Field of Classification Search
CPC . H10H 20/857; H10H 20/0364; H10L 25/167
See application file for complete search history.

(56) References Cited

U.S. PATENT DOCUMENTS

2014/0353603 A1 12/2014 Lee et al.
2020/0075826 A1* 3/2020 Takeya ................ H01L 25/0753
(Continued)

FOREIGN PATENT DOCUMENTS

CN 103943649 A 7/2014
CN 110164942 A 8/2019
(Continued)

OTHER PUBLICATIONS

Ueno et al., CN 108506897, Sep. 7, 2018 (Year: 2018).*
Wang et al., CN 110164942, Aug. 23, 2019 (Year: 2019).*
Lim et al., WO 2019108010, Jun. 6, 2019 (Year: 2019).*

*Primary Examiner* — Mary Ellen Bowman
(74) *Attorney, Agent, or Firm* — WHDA, LLP

(57) ABSTRACT

The present application provides a light emitting panel, a preparation method thereof, and a light emitting apparatus. The light emitting panel includes: a driving baseboard, including first conductive portions and driving units arranged in an array, and the first conductive portions are insulated from the driving units; light emitting devices arranged on the driving baseboard in an array, each of the light emitting devices includes a first electrode and a second electrode, the second electrode being electrically connected to one of the driving units, and the first electrode being electrically connected to the first conductive portion; a junction where at least one first electrode is electrically connected to the first conductive portion is different from junctions where first electrodes other than said first electrode are electrically connected to first conductive portions other than said first conductive portion.

16 Claims, 5 Drawing Sheets

(56)  References Cited

U.S. PATENT DOCUMENTS

2020/0176722 A1    6/2020 Lu et al.
2021/0296538 A1*   9/2021 Li ........................ H10H 20/857
2022/0328611 A1*  10/2022 Lu ...................... H10K 59/1315

FOREIGN PATENT DOCUMENTS

CN      110416437 A    11/2019
CN      112086487 A    12/2020

* cited by examiner

LIGHT EMITTING PANEL, PREPARATION METHOD THEREOF, AND LIGHT EMITTING APPARATUS

TECHNICAL FIELD

The present application relates to the field of display technology, in particular to a light emitting panel, a preparation method thereof, and a light emitting apparatus.

BACKGROUND

Micro Light Emitting Diodes (Micro LED for short) and Mini Light Emitting Diodes (Mini LED for short) are the main force in the development of LED technology in recent years. Micro/Mini LED light-emitting chips can be widely used in liquid crystal display backlight source, Micro/Mini RGB display, small pitch display and other fields.

At present, Micro/Mini LED light-emitting chips need a large current to achieve better luminous efficiency. However, the large current will bring many problems to Micro/Mini LED light-emitting chips. Therefore, a new type of light-emitting chip is urgently needed to solve the problems caused by the large current.

SUMMARY

Embodiments of the present application adopt technical solutions described below.

In one aspect, an embodiment of the present disclosure provides a light emitting panel, including:

a driving baseboard, including a plurality of first conductive portions and a plurality of driving units arranged in an array, the first conductive portions are insulated from the driving units;

a plurality of light emitting devices arranged on the driving baseboard in an array, each of the light emitting devices comprises a first electrode and a second electrode, the second electrode being electrically connected to one of the driving units, and the first electrode being electrically connected to the first conductive portion; and a junction where at least one first electrode is electrically connected to the first conductive portion is different from junctions where first electrodes other than said first electrode are electrically connected to first conductive portions other than said first conductive portion.

Optionally, all first electrodes are divided into multiple groups, each of the groups comprises at least one first electrode, and the groups are electrically connected to different first conductive portions respectively.

Optionally, each of the groups includes one of the first electrodes, and each of the first electrodes is electrically connected to one of the first conductive portions.

Optionally, each of the groups includes multiple first electrodes, and in each of the groups, at least one of the first electrodes is electrically connected to a different first conductive portion.

Optionally, in each of the groups, all of the first electrodes are electrically connected to one of the first conductive portions.

Optionally, each group includes at least three light emitting devices of different colors, and the light emitting devices of different colors are electrically connected to different first conductive portions respectively.

Optionally, the light emitting panel includes at least red light emitting devices, blue light emitting devices and green light emitting devices. The red light emitting devices are electrically connected to one of the first conductive portions, the green light emitting devices are electrically connected to one of the first conductive portions, and the blue light emitting devices are electrically connected to one of the first conductive portions.

Optionally, the driving baseboard further includes a second conductive portion disposed between the light emitting device and the driving unit, the light emitting device is electrically connected to the driving unit through the second conductive portion; the second conductive portion is insulated from the first conductive portion;

at least one of the plurality of first conductive portions is arranged in a same layer as the second conductive portion;

or, at least one of the plurality of first conductive portions is arranged in the same layer as the driving units.

Optionally, in the case that at least one of the plurality of first conductive portions is arranged in the same layer as the second conductive portion, all the first conductive portions are arranged in the same layer as the second conductive portion.

Optionally, the light emitting device includes a light emitting unit, the light emitting unit includes a side surface, a first surface and a second surface opposite to each other, the first surface and the second surface are connected to the side surface respectively, and the second surface is located on a side of the light emitting unit facing away from the driving backplane;

the light emitting device further includes an insulation portion and an auxiliary electrode, the insulating portion covers at least one side surface of the light emitting unit, the auxiliary electrode is at least located on a side of the insulation portion facing away from the light emitting unit, and is electrically connected to the light emitting unit.

Optionally, the insulation portion covers all side surfaces of the light emitting unit;

the auxiliary electrode is located on the side of the insulation portion facing away from the light emitting unit, and covers at least part of the second surface of the light emitting unit.

Optionally, the light emitting unit includes the second electrode, an epitaxial wafer, and the first electrode successively stacked on the driving backplane, the auxiliary electrode is electrically connected to the first electrode, and covers at least a part of the first electrode.

Optionally, the light emitting device further includes a reflective layer disposed between the driving backplane and the second electrode.

Optionally, the driving baseboard includes a first substrate, and the plurality of first conductive portions and the plurality of driving units arranged in an array are all disposed on the first substrate; the first substrate is a silicon substrate.

In another aspect, an embodiment of the present disclosure provides a light emitting apparatus including the above described light emitting panel.

In yet another aspect, an embodiment of the present disclosure provides a preparation method of the above described light emitting panel, including:

forming a driving baseboard and a plurality of light emitting devices; the driving baseboard includes a plurality of first conductive portions and a plurality of driving units arranged in an array, and the first conductive portions are insulated from the driving units; the plurality of light emitting devices arranged on the driving baseboard in an array, each of the light emitting devices comprises a first electrode and a second electrode, the second electrode being electrically connected to one of the driving units, and the first electrode being electrically connected to the first conductive portion; and a junction where at least one first electrode is electrically connected to the first conductive portion is different from junctions where first electrodes other than said first electrode are electrically connected to first conductive portions other than said first conductive portion.

The above-mentioned description is merely an overview of the technical solutions of the present disclosure. In order to know about the technical means of the present disclosure more clearly so that the solutions according to the contents of the specification may be implemented, and in order to make the above-mentioned and other objects, features and advantages of the present disclosure more apparent and understandable, specific implementations of the present disclosure are set forth below.

BRIEF DESCRIPTION OF THE DRAWINGS

In order to describe the embodiments of the present disclosure or the technical solutions in the related art more clearly, the accompanying drawings which are used in the description of the embodiments or the related art will be briefly introduced. Apparently, the accompanying drawings in the following description illustrate merely some embodiments of the present disclosure, and those skilled in the art may obtain other accompanying drawings based on these accompanying drawings without paying any creative effort.

DETAILED DESCRIPTION OF THE EMBODIMENTS

Figure 1:
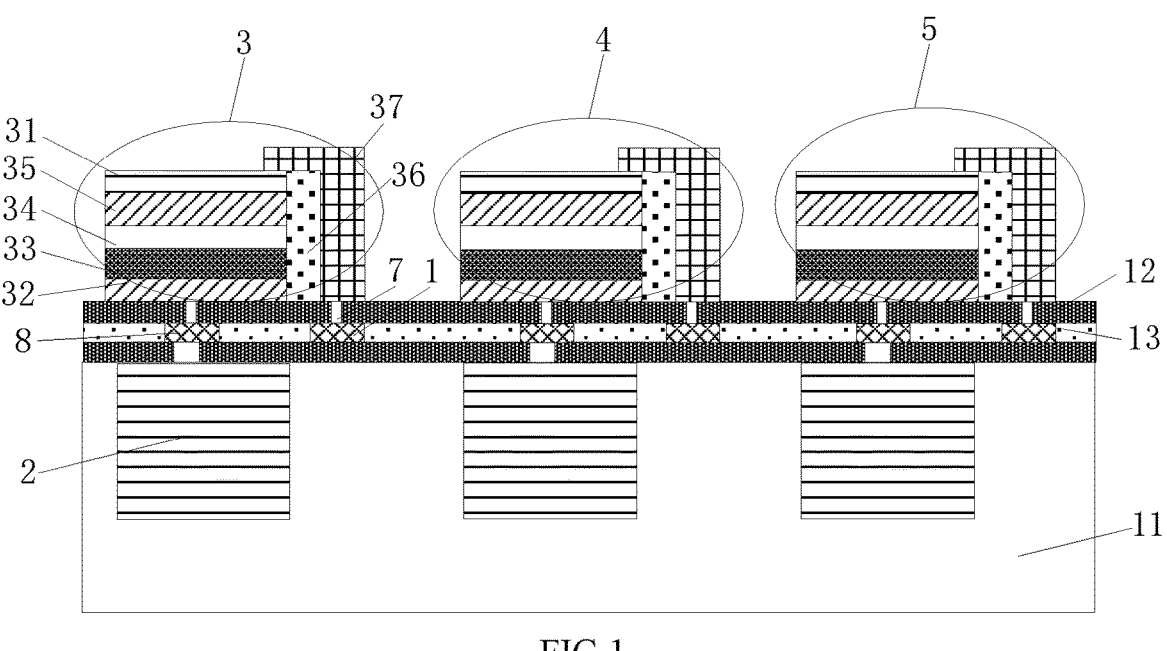
FIG. 1 is a schematic structural diagram illustrating a light emitting panel provided by an embodiment of the present application.

In order to make objects, solutions and advantages of embodiments of the present application clearer, a clear and thorough description for technical solutions in the embodiments of the present disclosure will be given below in conjunction with the accompanying drawings in the embodiments of the present disclosure. Apparently, the described embodiments are a part of embodiments of the present disclosure, not all the embodiments. All other embodiments obtained, based on the embodiments in the present disclosure, by those skilled in the art without paying creative effort fall within the protection scope of the present disclosure.

In the drawings, the thicknesses of regions and layers may be exaggerated for clarity. Same or similar structures are marked with same reference numerals, and thus the detailed descriptions thereof will be omitted. Furthermore, the drawings are merely schematic illustrations of the present disclosure and are not necessarily drawn to scale.

In the embodiments of the present application, unless otherwise specified, "plurality" means two or more. The orientation or positional relationship indicated by the term "on" is based on the orientation or positional relationship shown in the drawings, and is only for the convenience of describing the present application and simplifying the description, rather than indicating or implying that the structure or element referred to must have a specific orientation, be constructed and operated in a specific orientation, and therefore cannot be construed as a limitation on the present application.

Unless it is required in the context, otherwise, the terms "comprising" throughout the specification and claims are interpreted in an open and inclusive sense, i.e., "comprising, but not limited to". In the description of the specification, the terms "one embodiment", "some embodiments", "exemplary embodiment", "example", "specific example" or "some examples" are intended to indicate that specific features, structures, materials or characteristics related to the embodiment or examples are included in at least one embodiment or example of the present application. Schematic representations of the above terms are not necessarily referring to the same embodiment or example. Furthermore, the particular features, structures, materials or characteristics described may be included in any suitable manner in any one or more embodiments or examples.

In the embodiments of the present application, wordings such as "first" and "second" are used to distinguish the same or similar items with basically the same function and effect, and are only used for clearly describing the technical solutions of the embodiments of the present application, and cannot be understood as indicating or implying relative importance or implicitly indicating the number of indicated technical features.

In the embodiments of the present application, the term "electrically connected" may refer to the direct electrical connection of two components, or may refer to the electrical connection between two components via one or more other components. "Electrical connection" may refer to an electrical connection through wires, or may refer to electrical connection through radio signals.

Figure 2:
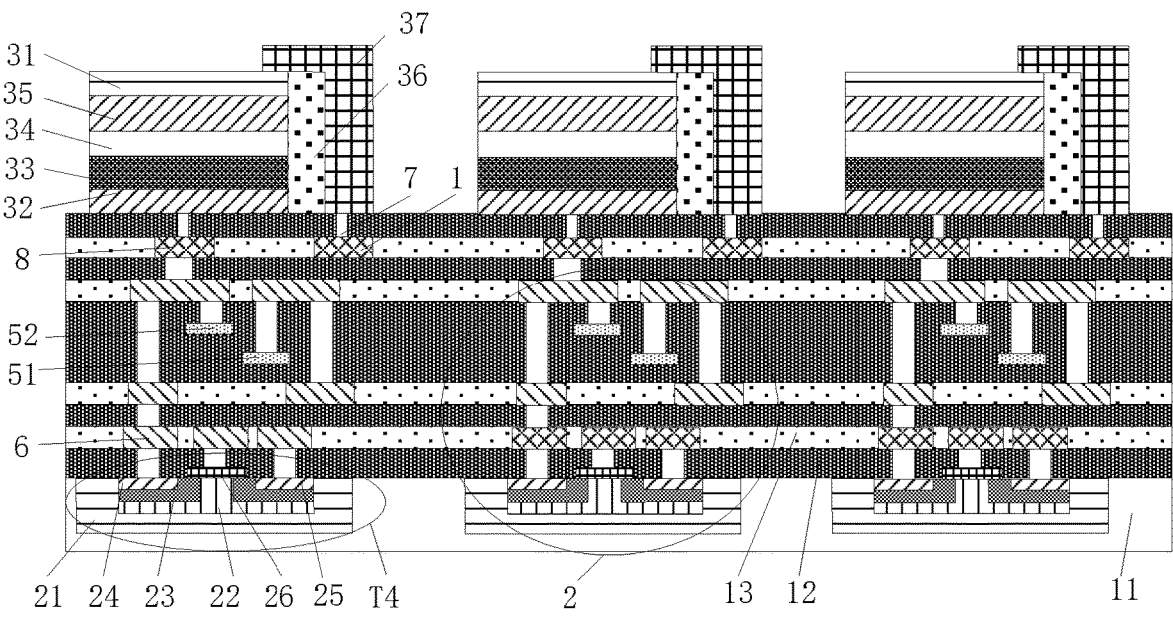
FIG. 2 is a schematic structural diagram illustrating another light emitting panel provided by an embodiment of the present application.

An embodiment of the present application provides a light emitting panel. As shown in FIG. 1 and FIG. 2, the light emitting panel includes:

a driving baseboard including a plurality of first conductive portions 1 and a plurality of driving units 2 arranged in an array, the first conductive portions 1 being insulated from the driving units 2;

a plurality of light emitting devices arranged on the driving baseboard in an array, each light emitting device including a first electrode 31 and a second electrode 32, each second electrode 32 being electrically connected to one driving unit 2, and the first electrode 31 being electrically connected to the first conductive portion 1; a junction where at least one first electrode 31 is electrically connected to one first conductive portion 1 being different from junctions where first electrodes 31 other than the first electrode 31 are electrically connected to first conductive portions 1 other than the first conductive portion 1.

The type of the driving baseboard is not specifically limited. For example, the driving baseboard may be prepared through a mature integrated circuit CMOS (Complementary Metal Oxide Semiconductor) process so that the CMOS driving baseboard can realize active addressing of pixels, and the driving baseboard includes various circuits such as a timer control register (TCON) and an over current protection (OCP), and can achieve lightweight. Certainly, the driving baseboard may also be other types of driving backplanes. Embodiments of the present application are explained by taking the driving baseboard as a CMOS driving backplane as an example.

The structure of the driving baseboard is not specifically limited. Exemplarily, the driving baseboard may include structures such as a driving unit, an insulation layer, and a conductive layer. Here, the material and number of layers of the insulation layer are not specifically limited. For example, the material of the insulation layer may be any one of silicon nitride, silicon oxide or silicon oxynitride or a combination thereof. For example, the insulation layer may include one layer, or the insulation layer also includes multiple layers. The number of layers of the insulation layer may be determined according to the number of layers of the conductive layer, as long as there is at least one insulation layer between adjacent conductive layers. Here, the material and number of layers of the conductive layer are not specifically limited. For example, the material of the conductive layer may be metal or the like. For example, the conductive layer may include one layer, or may include multiple layers. The number of layers of the conductive layer may be determined according to the function of the driving baseboard. As an example, FIG. 1 illustrates that one conductive layer 13 and two insulation layers 12 are disposed between the driving unit 2 and the light emitting device. As an example, FIG. 2 illustrates that the driving baseboard includes multiple insulation layers 12 and multiple conductive layers 13, and one insulation layer 12 is disposed between adjacent conductive layers 13.

It should be noted that, as shown in FIG. 2, each conductive layer 13 may include at least one conductive unit 6 configured to implement a specific function. Reference may be made to related technologies to obtain the use of the conductive units in each conductive layer. Here, only the content related to the creative idea of the present application is introduced, and no detailed description will be given here. Referring to FIG. 2, each insulation layer 12 may include at least one via hole 7, so that an electrical connection between the conductive units 6 to be electrically connected on both sides of the insulation layer 12 may be achieved through the via hole 7.

Here, the material, structure and the like of the first conductive portion are not specifically limited. For example, the material of the first conductive portion may be metal, such as tungsten. For example, the first conductive portion may include a common electrode line (Vcom line), so that the common voltage may be transferred to the light emitting device through the Vcom line. Of course, the first conductive portion is not limited to transferring the Vcom signal to the light emitting device. In the embodiments of the present application, illustration is made by taking transferring the Vcom signal to the light emitting device by the first conductive portion as an example.

Figure 3:
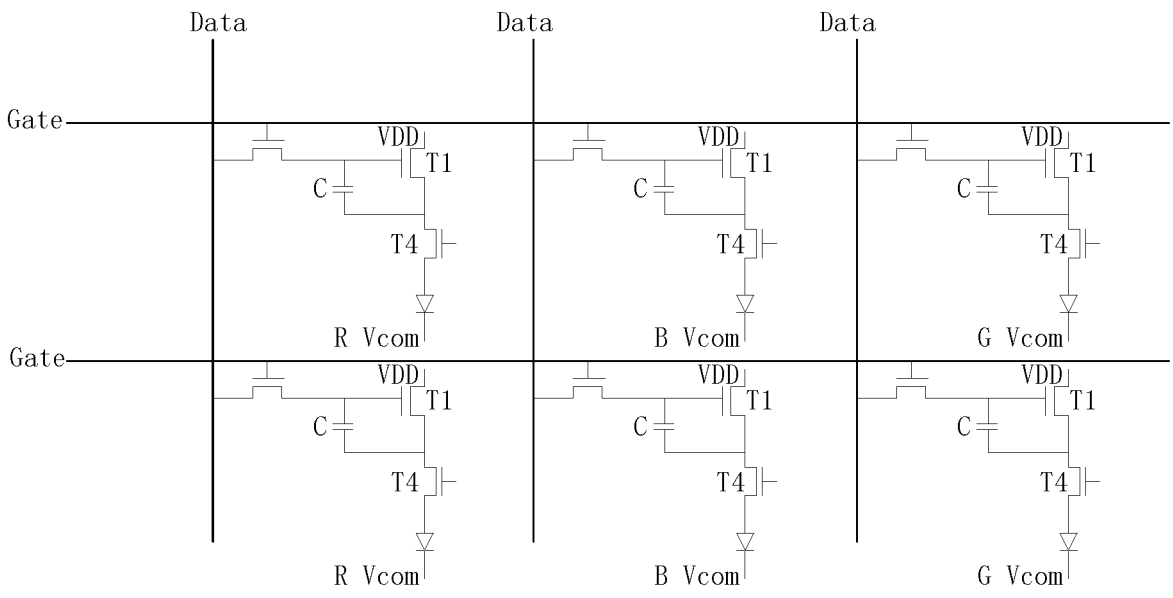
FIG. 3 is a schematic structural diagram illustrating a driving unit provided by an embodiment of the present application.

The structure of the driving unit is not specifically limited here. For example, the driving unit may include two transistors and a capacitor (2TIC); or, the driving unit may include four transistors and a capacitor (4TIC); or, the driving unit may include five transistors and a capacitor (5TIC). The embodiments of the driving unit in this application are not limited thereto. In other embodiments, the driving unit may also include more transistors, more capacitors, or resistors (R) and other more electronic devices, which may be specifically determined according to the design of the driving pixel circuit in the silicon-based backplane, and no limitation is made here. As can be seen from FIG. 2 to FIG. 3, the driving unit 2 provided by an embodiment of the present application may include a capacitor C, a switching transistor T1 and a driving transistor T4. An end 51 of the capacitor C is electrically connected to the switching transistor T1, and the other end 52 of the capacitor C is electrically connected to the driving transistor T4. In this case, the driving unit shown in FIG. 3 is a current-type driving unit. As an example, FIG. 3 shows driving units in two rows and three columns. Referring to FIG. 3, the gate lines Gate and the data lines Data constitute driving units in two rows and three columns. The first column of driving units are used for driving red (R) light emitting devices, the second column of driving units are used for driving blue (B) light emitting devices, and the third column of driving units are used for driving green (G) light emitting devices. One end of the light emitting device in each driving unit is provided with the Vcom signal, and one end of the switching transistor T1 in each driving unit is provided with a power signal VDD.

Figure 4:
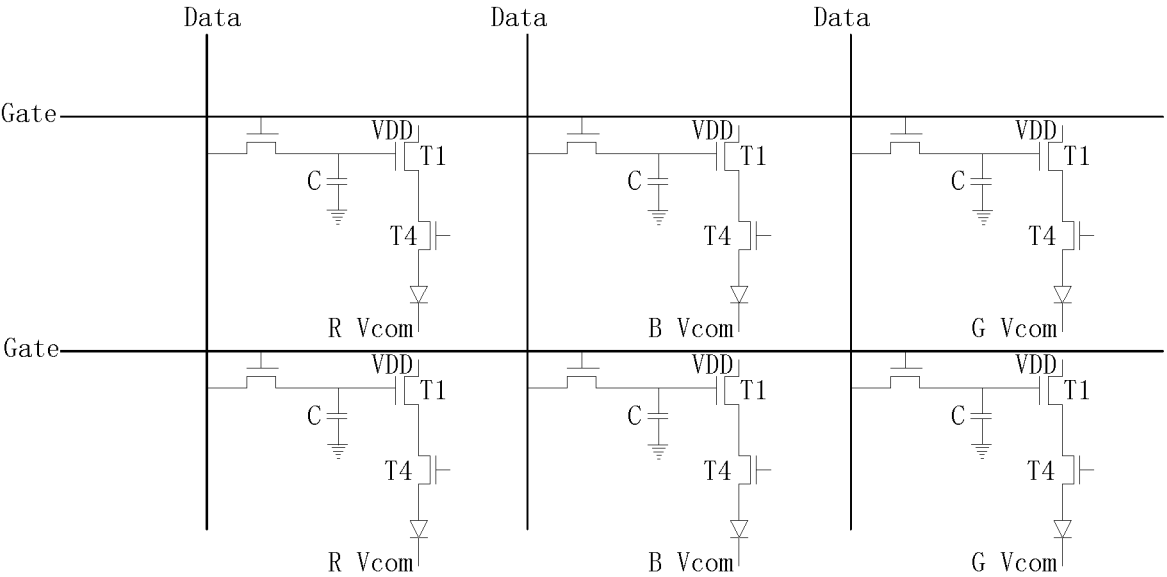
FIG. 4 is a schematic structural diagram illustrating another driving unit provided by an embodiment of the present application.

The driving unit may also without a doubt be a voltage-type driving unit as shown in FIG. 4. Referring to FIG. 4, the difference between FIG. 4 and FIG. 3 is that one end of the capacitor C in FIG. 3 is electrically connected to the driving transistor T4, while one end of the capacitor C in FIG. 4 is grounded.

It should be noted that, in an exemplary embodiment, the driving baseboard may further include at least a top metal layer, and the top metal layer may include a plurality of second conductive portions 8.

In an exemplary embodiment, referring to FIG. 2, the driving transistor T4 includes a deep well layer 21, an active layer 22, a conductive layer 23, a source-drain metal layer and a gate layer formed on the first substrate 11. The source-drain metal layer includes multiple source electrodes 24 and multiple drain electrodes 25, and the gate layer includes multiple gate electrodes 25.

In addition, the types of the transistors in the driving unit are not limited here. For example, the transistors may include a N-type transistor; or, the transistors may include a P-type transistor; or, the transistors may include both the N-type transistor and the P-type transistor.

In the embodiments of the present application, the driving unit can be understood as a pixel driving circuit.

The type, structure, color, etc. of the light emitting device are not specifically limited herein. For example, the light emitting device may include a Micro LED chip; or, the light emitting device may also include a Mini LED chip. For example, the light emitting device may include two electrodes and an epitaxial wafer, and the epitaxial wafer generally includes an electron injection layer, an emission layer, and a hole injection layer stacked in sequence. For example, the light emitting devices may all emit light of the same color; or, all of the light emitting devices may emit light of different colors; or, some of the light emitting devices may emit light of the same color. As an example, FIG. 1 and FIG. 2 both illustrate that light emitting devices include a red light emitting device 3, a green light emitting device 4 and a blue light emitting device 5.

There is no specific limitation on the distance between adjacent light emitting devices herein. For example, when the size range of a single light emitting device is less than 50 μm, the distance between adjacent light emitting devices may be 5 μm~100 μm, preferably 10 μm~30μ m.

The material of the first electrode is not specifically limited here. For example, the material of the first electrode may include metal, etc., for example, ITO (Indium Tin Oxides), chromium/platinum/gold, titanium/gold, titanium/silver/indium tin oxide (Ti/Ag/ITO) and the like.

The material of the second electrode is not specifically limited here. For example, the material of the second electrode may include metal such as copper (Cu), tin (Sn), silver (Ag), gold (Au), and indium (In). A bonding such as Cu—Sn, Sn—Ag, Sn—In, Sn—Au, Au—In, Cu—In bonding may occur between the material of the second electrode and the material of the second conductive portion. Among them, Cu—Sn means that if the material of the second electrode is Cu and the material of the second conductive portion is Sn, the two can be bonded; or, if the material of the second electrode is Sn and the material of the second conductive portion is Cu, the two can be bonded.

The polarities of the first electrode and the second electrode are not specifically limited herein. For example, the first electrode may be an N-type electrode, and the second electrode may be a P-type electrode; or, the first electrode may be a P-type electrode, and the first electrode may be an N-type electrode. As an example, the light emitting device in both FIG. 1 and FIG. 2 includes one first electrode 31 that is an N-type electrode, and one second electrode 32 that is a P-type electrode.

Each of the second electrodes is electrically connected to one driving unit, and the manner in which the second electrode is electrically connected to the driving unit is not specifically limited here. For example, the second electrode may be electrically connected to the driving unit directly; or, the second electrode may be electrically connected to the driving unit through other structures. As an example, the second electrode is electrically connected to the driving unit 2 through the second conductive portion 8 in both FIG. 1 and FIG. 2.

The first electrode is electrically connected to the first conductive portion, and the manner in which the first electrode is electrically connected to the first conductive portion is not specifically limited here. For example, the first electrode may be electrically connected to the first conductive portion directly; or, the first electrode may be electrically connected to the first conductive portion through other structures. For example, the first electrode 31 is electrically connected to the first conductive portion 1 through an auxiliary electrode 37 in both FIG. 1 and FIG. 2.

A junction where at least one first electrode is electrically connected to one first conductive portion being different from junctions where first electrodes other than this first electrode are electrically connected to first conductive portions other than this first conductive portion means one of the following: each first electrode is electrically connected to one first conductive portion, that is, all the junctions of the first electrode and the first conductive portion are different; or, some first electrodes may be electrically connected to one first conductive portion, and other first electrodes may be electrically connected to another first conductive portion, that is, the junctions of some first electrodes and the first conductive portion are the same, and different from the junctions of other first electrodes and the first conductive portion; or, some first electrodes may be electrically connected to one first conductive portion, and, each first electrode among the other first electrodes may be electrically connected to one first conductive portion. Of course, it is not limited to the above-mentioned situations, and other situations may also be used according to actual needs, which will not be repeated here. For example, each first electrode 31 is electrically connected to one first conductive portion 1 in both FIG. 1 and FIG. 2.

Figure 5:
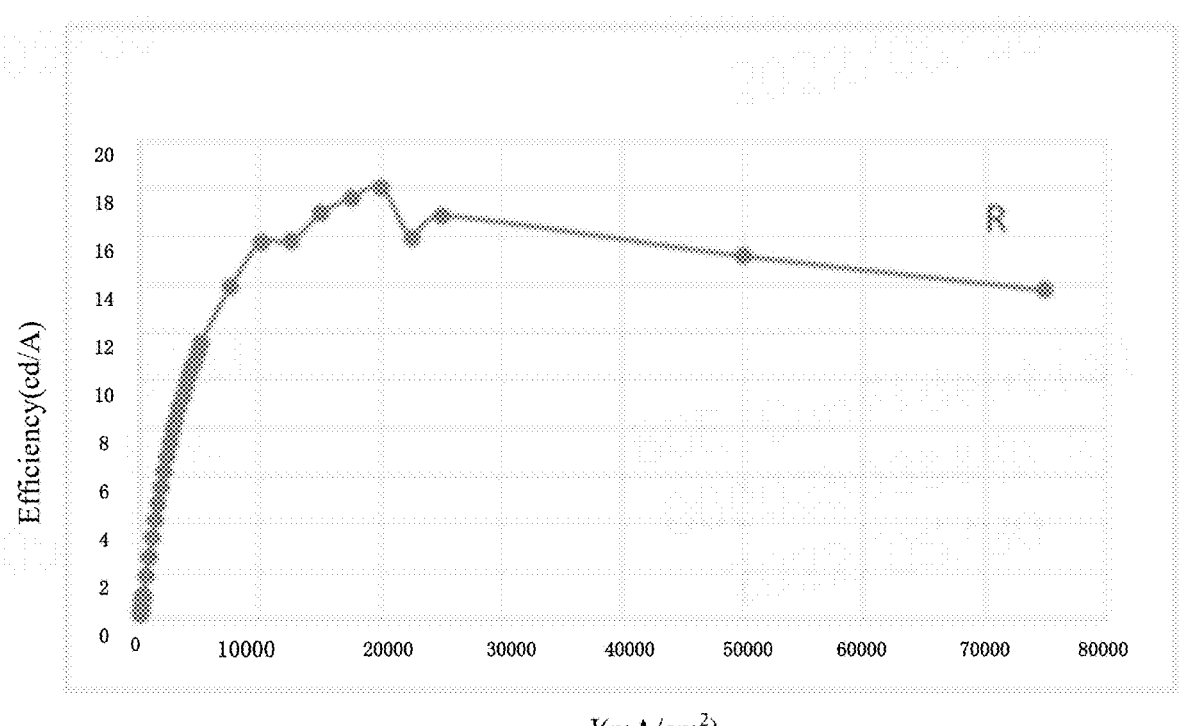
FIG. 5 is a schematic diagram illustrating a luminous efficiency changing with current density in the related art provided by the embodiment of the present application.

The current micro-display technology of silicon (driving) substrate+Micro/Mini LED light-emitting chip is compatible with semiconductor technology, and is suitable for mass production. Compared with other micro-display technologies, the silicon substrate+LED technology has advantages of not needing a backlight source, being relatively light and thin, simple in optical system design, and fast in response. Compared with OLED micro-display technology, the silicon substrate+LED micro-display technology uses semiconductor and metal materials, which has the advantages of high brightness, high temperature resistance, and long service life, and thus it has been widely studied. However, the current silicon substrate+LED technology requires a large current to achieve high luminous efficiency. Referring to FIG. 5, when the current density reaches 10 A/cm$^2$ and above, the efficiency is significantly improved. The current density in the efficiency region commonly used by silicon substrate+LED has also reached the order of A/cm$^2$. However, large current will bring many defects to the silicon substrate+LED display, such as large IR drop (voltage drop) and increased power consumption.

In order to solve the above problems, the embodiment of the present application provides a light emitting panel, including a driving baseboard and a plurality of light emitting devices arranged in an array on the driving baseboard; the driving baseboard includes a plurality of first conductive portions and a plurality of driving units arranged in an array, and the first conductive portions are insulated from the driving units; each of the light emitting devices includes a first electrode and a second electrode, each second electrode is electrically connected to one driving unit, and the first electrode is electrically connected to the first conductive portion; a junction where at least one first electrode is electrically connected to one first conductive portion is different from junctions where first electrodes other than this first electrode are electrically connected to first conductive portions other than this first conductive portion. In this way, on the one hand, since at least one first electrode is no longer electrically connected to other first electrodes, at least one first electrode can be independently controlled by the voltage on the first conductive portion, thereby effectively reducing the serious IR drop problem caused by the large resistance of the first electrode if a transparent first electrode is used on the light emitting surface of the light emitting device; On the other hand, since at least one first electrode can be individually controlled by the voltage on the first conductive portion, that is, at least one first electrode can be independently patterned, the at least one first electrode can be dynamically adjusted and controlled independently to reduce power consumption.

Optionally, all the first electrodes are divided into multiple groups. Each group includes at least one first electrode, and each group is electrically connected to a different first conductive portion. Therefore, a regional control can also be performed on the first electrodes while reducing the IR drop problem caused by high current and reducing power consumption.

No specific limitation is made on the quantity of the first electrodes included in each of the groups. For example, each of the groups may include only one first electrode; or, each of the groups may include a plurality of first electrodes. In the case that each of the groups includes a plurality of first electrodes, no specific limitation is made on the number of the first conductive portions electrically connected to the plurality of first electrodes in each group. As an example, all the first electrodes in each group may be electrically connected to one first conductive portion; or, multiple first electrodes in each group may be electrically connected to different first conductive portions.

Hereinafter, 10 first electrodes are taken as an example for description.

In a first situation, the 10 first electrodes may be classified into 10 groups. In this case, each group includes one first electrode, and each first electrode is electrically connected to one first conductive portion, that is, there are 10 first conductive portions.

In a second situation, the 10 first electrodes may be classified into 3 groups. In this case, the first group may include 3 first electrodes, the second group may include 3 first electrodes, and the third group may include 4 first electrodes, then the 3 first electrodes in the first group are electrically connected to one first conductive portion, the 3 first electrodes in the second group are electrically connected to one first conductive portion, and the 4 first electrodes in the third group are electrically connected to one first conductive portion.

In a third situation, the 10 first electrodes may be classified into 3 groups. In this case, the first group may include one first electrodes, the second group may include one first electrodes, and the third group may include eight first electrodes, then the one first electrode in the first group is electrically connected to one first conductive portion, the one first electrode in the second group is electrically connected to one first conductive portion, and the eight first electrodes in the third group are electrically connected to one first conductive portion.

In a fourth situation, the 10 first electrodes may be classified into 3 groups. In this case, the first group may include one first electrodes, the second group may include one first electrodes, and the third group may include eight first electrodes, then the one first electrode in the first group is electrically connected to one first conductive portion, the one first electrode in the second group is electrically connected to one first conductive portion, and every two first electrodes among the eight first electrodes in the third group are electrically connected to one first conductive portion.

It should be noted that, without a doubt, other situations other than the above four situations may also be included, which will not be repeated here.

Figure 6:
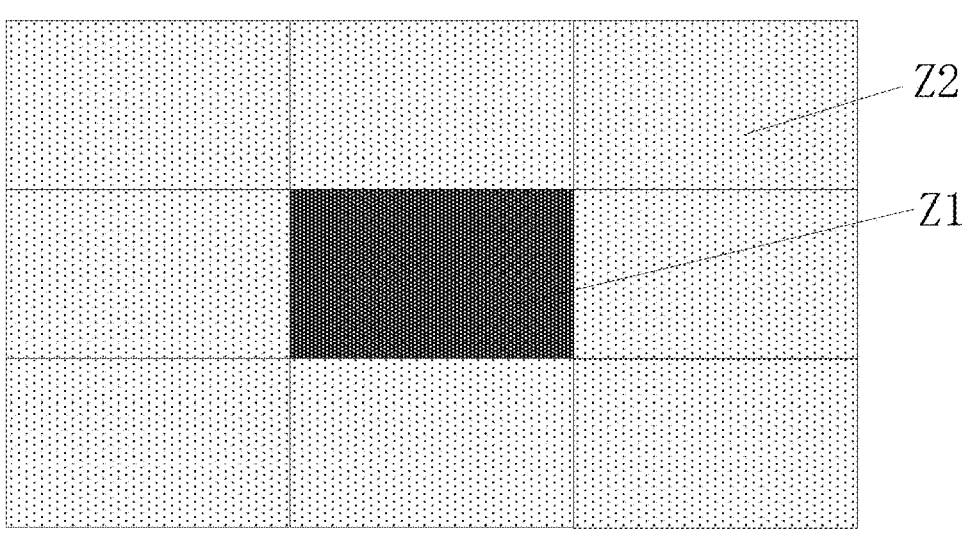
FIG. 6 is a schematic diagram of a region display provided by an embodiment of the present application.

The silicon (driving) substrate+Micro/Mini LED light-emitting chip can be applied in near-eye displays such as augmented reality (AR)/virtual reality (VR). One of the most important application scenarios in near-eye displays such as AR/VR is foveated rendering, that is, the display screen that human eyes watch needs to be high-definition and have a high refresh rate, and the screen that human eyes are not watching can be low brightness and have a low refresh rate, as shown in FIG. 6. Referring to FIG. 6, zone Z1 is a high-definition zone, and the other zones Z2 are low-definition zones. For example, in FIG. 6, the screen may be divided into nine areas, and the Vcom signal in each area is controlled independently. In this case, the LED does not need a higher cross-voltage, and the Vcom signal in the low-definition area can be set higher; the Vcom signal in the high-definition area can be pulled down, so as to obtain a larger cross-voltage and a high brightness display. This has great advantages in reducing power consumption and improving display effects.

Optionally, each group includes one first electrode, and each first electrode is electrically connected to one first conductive portion.

Description is made below based on an example where the driving substrate shown in FIG. 1 and FIG. 2 includes a red light emitting device 3, a green light emitting device 4 and a blue light emitting device 5, and the first electrodes in the light emitting devices of different colors are electrically connected to one first conductive portion.

Table 1 provides values of turn-on voltages (driving voltage Vcom) of the red (R) light-emitting diode (LED), green (G) LED and blue (B) LED. As can be seen from Table 1 that the turn-on voltages of the R LED, G LED and B LED are inconsistent, and the driving voltage of the R LED is the lowest. In the related art, since the cathodes of multiple light emitting devices are arranged as an entire surface and controlled by the same driving voltage, Vcom of the light emitting devices can only be designed to be the same value. In order to ensure the contrast, Vcom can only be set to be the driving voltage of the R LED, such as −1.25V. In this case, in order to obtain higher blue light, a larger data voltage is required to increase the cross-voltage of the B LED, which leads to increased power consumption.

TABLE 1

| LED type | R (7200 μm^2) | G (5916 μm^2) | B (5916 μm^2) |
|---|---|---|---|
| Turn-on voltage/v | 1.25@0.2 nit | 1.88@0.22 nit | 2.12@0.2 nit |

In Table 1, 7200 μm^2 represents the size of the R LED, 5916 μm^2 represents the size of the G LED, and 5916 μm^2 represents the size of B LED.

In the light emitting panel provided by the embodiment of the present application, each first electrode is electrically connected to one first conductive portion, so that each first electrode can be independently controlled, thereby minimizing the IR drop problem caused by the large current and most effectively reducing the power consumption. Referring to FIG. 1 and FIG. 2, the first electrode 31 of the red light emitting device 3 is electrically connected to the first conductive portion 1 through the auxiliary electrode 37 and the via hole 7. At this time, the first conductive portion 1 may be supplied with the Vcom signal. Similarly, the first electrodes of the green light emitting device 4 and the blue light emitting device 5 can also be supplied with independent Vcom signals. Thus, the Vcom signals of the R LED, the G LED and the B LED may be set to be different values respectively. For example, the turn-on voltage of the R LED is generally 1.7V, and the turn-on voltage of the B LED is generally 2V, so the Vcom signal of the R LED may be set to be −1.7 V, and the Vcom signal of the B LED may be set to be −2V, thereby saving a power consumption of (0.38*I0*resolution). That is, when the Vcom signals of the R LED, the G LED, and the B LED can be independently controlled, these Vcom signals can be set independently according to needs, and the voltage or current provided by the DMOS backplane can be reasonably used.

Optionally, each group includes a plurality of first electrodes, and at least one first electrode in each group is electrically connected to a different first conductive portion. Therefore, the first electrodes in each group can be further controlled depending on conditions, the IR drop problem caused by the large current can be further reduced, and the power consumption can be effectively reduced.

At least one first electrode in each group being electrically connected to a different first conductive portion means one of the following: each first electrode in each of the groups is electrically connected to one first conductive portion; or, one first electrode in each of the groups is electrically connected to one first conductive portion, and the remaining first electrodes are electrically connected to one conductive portion; or, the plurality of first electrodes in each group are electrically connected to one first conductive portion respectively, and the remaining first electrodes are electrically connected to one conductive portion, which is not specifically limited here.

Optionally, all the first electrodes in each group are electrically connected to one first conductive portion. Therefore, the first electrodes can be controlled in groups, which is convenient for preparation, simple and easy to implement.

Optionally, the light emitting panel includes at least three types of light emitting devices of different colors, and each type of the light emitting device of a different color forms a group. Therefore, the same control can be performed on the light emitting devices of the same color, and different controls can be performed on the light emitting devices of different colors, so that the light emission of the light emitting panel can be controlled more effectively, and it is also simple and easy to implement.

Here, there is no specific limitation on the colors of the three types of light emitting devices of different colors included in the light emitting panel. For example, the light emitting panel may at least include any three of the red light emitting devices, the green light emitting devices, the blue light emitting devices, the yellow light emitting devices and the like.

Optionally, each group includes at least three light emitting devices of different colors, and each light emitting device of a different color is electrically connected to a different first conductive portion. Therefore, on the basis of grouping the light emitting devices, it is also possible to control the light emitting devices of different colors in each group, thereby realizing more accurate light-emitting control, further reducing the IR drop problem caused by the large current, and further reducing the power consumption.

Here, there is no specific limitation on the colors of the at least three light emitting devices of different colors in each group. For example, each of the above groups may include light emitting devices of any three colors of red, green, blue, yellow and so on.

Optionally, the light emitting panel includes at least red light emitting devices, blue light emitting devices and green light emitting devices, the red light emitting devices are electrically connected to one first conductive portion, the green light emitting devices are electrically connected to one first conductive portion, and the blue light emitting devices are electrically connected to one first conductive portion. Therefore, the red light emitting devices, the blue light emitting devices and the green light emitting devices can be controlled separately, so that the luminous effects of various colors can also be controlled while reducing the IR drop problem caused by the large current and reducing the power consumption, thereby improving the luminescence of the light emitting panel.

The number and structure of the red light emitting devices, blue light emitting devices and green light emitting devices are not specifically limited here. As an example, the number of the red light emitting devices, blue light emitting devices and green light emitting devices may be one or more. For example, the red light emitting device may include a light emitting layer emitting red light, the blue light emitting device may include a light emitting layer emitting blue light, and the green light emitting device may include a light emitting layer emitting green light. Alternatively, the red light emitting device may include a light emitting layer emitting blue light and a quantum dot layer on the light emitting layer, the blue light emitting device may include a light emitting layer emitting blue light, and the green light emitting device may include a light emitting layer emitting blue light and a quantum dot layer on the light emitting layer.

Here, there is no specific limitation on the manner in which the red light emitting device is electrically connected to one first conductive portion. As an example, the red light emitting device may be directly electrically connected to one first conductive portion; or, the red light emitting device may be electrically connected to one first conductive portion through other structures. The manner in which the blue light emitting device and the green light emitting device are electrically connected to the first conductive portion may refer to the manner in which the red light emitting device is electrically connected to the first conductive portion, which will not be repeated here.

Optionally, as shown in FIG. 1 and FIG. 2, the drive baseboard further includes a second conductive portion 8 disposed between the light emitting device and the driving unit 2. The light emitting device is electrically connected to the driving unit 2 through the second conductive portion 8. The second conductive portion 8 is insulated from the first conductive portion 1.

Referring to FIG. 1 and FIG. 2, at least one of the plurality of first conductive portions 1 is arranged in the same layer as the second conductive portions 8.

Here, there is no specific limitation on the material of the second conductive portion. For example, the material of the second conductive portion may include metal, such as copper (Cu), tin (Sn), silver (Ag), gold (Au), indium (In).

At least one of the plurality of first conductive portions being arranged in the same layer as the second conductive portions means one of the following: one first conductive portion is arranged in the same layer as the second conductive portions, and the other first conductive portions are not arranged in the same layer as the second conductive portions; or, multiple first conductive portions are arranged in the same layer as the second conductive portions, and the other first conductive portions are not arranged in the same layer as the second conductive portions; or, all the first conductive portions are arranged in the same layer as the second conductive portions. As an example, all the first conductive portions 1 are arranged in the same layer as the second conductive portions 8 in both FIG. 1 and FIG. 2. For first conductive portions that are not arranged in the same layer as the second conductive portions, these first conductive portions may be arranged in the same layer as the driving units. Alternatively, the first conductive portions may be arranged in the same layer as structures other than the driving unit and the second conductive portion, as long as the first conductive portions can be electrically connected to the first electrodes.

The second conductive portions in the embodiment of the present application may be a top metal layer (Top metal), so that the number of vias electrically connecting the first conductive portion and the first electrode can be reduced, which is convenient for preparation and saves time and costs. Moreover, since the metal layer of the top metal layer is used for metal traces, the material of the top metal layer is generally copper (Cu), and the square resistance is 0.002 ohms/square. Compared with Indium Zinc Oxide (IZO) (the square resistance is 60 ohms/square), the voltage drop is reduced by at least 30,000 times.

Alternatively, at least one first conductive portion among the plurality of first conductive portions is arranged in the same layer as the driving units.

At least one first conductive portion among the plurality of first conductive portions being arranged in the same layer as the driving units means one of the following: one first conductive portion is arranged in the same layer as the driving units, and the other first conductive portions are not arranged in the same layer as the driving units; or, multiple first conductive portions are arranged in the same layer as the driving units, and the other first conductive portions are not arranged in the same layer as the driving units; or, all the first conductive portions are arranged in the same layer as the driving units. For first conductive portions that are not arranged in the same layer as the driving units, these first conductive portions may be arranged in the same layer as the second conductive portions; or, these first conductive portions may be arranged in the same layer as structures other than the driving units and the second conductive portions, as long as the first conductive portions can be electrically connected to the first electrodes. For first conductive portions that are arranged in the same layer as the driving units, these first conductive portions may be arranged in the same layer as any film layer in the driving unit, for example, be arranged in the same layer as the gate layer in the driving unit, as long as the first electrodes can be electrically connected to the first conductive portions through via holes, and no specific limitation is made here.

It should be noted that, when the driving unit includes a multi-layer structure, at least one first conductive portion among the plurality of first conductive portions may be arranged in the same layer as any film layer in the driving unit. For example, all the first conductive portions and the same film layer in the drive unit are arranged in the same layer; or, each first conductive portion and one film layer in the drive unit are arranged in the same layer, and various first conductive portions are in different layers; or, some of the first conductive portions and one film layer in the driving unit are arranged in the same layer, and some of the first conductive portions are arranged in the same layer, etc., which are not specifically limited here.

Optionally, as shown in FIG. 1 and FIG. 2, in the case that at least one of the plurality of first conductive portions 1 and the second conductive portions 8 are arranged in the same layer, all the first conductive portions 1 and the second conductive portions 8 are arranged in the same layer. As a result, all the first conductive portions are arranged in the same layer as the second conductive portions as the top metal layer, so that all the first conductive portions can be electrically connected to the first electrodes through fewer via holes, which greatly simplifies the preparation process and reduces the costs.

Optionally, the light emitting device includes a light emitting unit. The light emitting unit includes a side surface, a first surface and a second surface opposite to each other. The first surface and the second surface are connected to the side surface respectively. The second surface is located on a side of the light emitting unit facing away from the driving backplane.

Referring to FIG. 1 and FIG. 2, the light emitting device further includes an insulation portion 36 and an auxiliary electrode 37. The insulating portion 36 covers at least one side surface of the light emitting unit. The auxiliary electrode 37 is at least located on the side of the insulation portion 36 facing away from the light emitting unit, and is electrically connected to the light emitting unit. Therefore, the first electrode can be electrically connected to the first conductive portion through the auxiliary electrode, which is simple and easy to implement.

Here, the structure, color and the like of the light emitting unit are not specifically limited. For example, the light emitting unit may include the red light emitting unit, the green light emitting unit and the blue light emitting unit as shown in FIG. 1 and FIG. 2. For example, the light emitting unit may include a second electrode, an epitaxial wafer, and a first electrode that are sequentially stacked.

The insulating portion covering at least one side surface of the light emitting unit means one of the following: the insulation portion 36 may cover only one side surface of the light emitting unit, as shown in FIG. 1 and FIG. 2; or, the insulation portion may cover all side surfaces of the light emitting unit, which is not specifically limited here.

There is no specific limitation on the material of the insulation portion. For example, the material of the insulation portion may be any one of silicon nitride, silicon oxide, or silicon oxynitride, or a combination thereof.

The auxiliary electrode is located at least on a side of the insulation portion facing away from the light emitting unit, and is electrically connected to the light emitting unit. Here, the auxiliary electrode being located on at least one side of the insulation portion facing away from the light emitting unit means one of the following: as shown in FIG. 1 and FIG. 2, the insulation portion 36 may cover only one side surface of the light emitting unit, in this case, only one side surface of the light emitting unit is provided with the auxiliary electrode 37, so that the first electrode 31 is electrically connected to the first conductive portion 1 through the auxiliary electrode 37; or, the insulation portion may also cover all side surfaces of the light emitting unit, in this case, all side surfaces away from the light emitting unit are provided with auxiliary electrodes, so that the first electrode may be electrically connected to the first conductive portion through multiple auxiliary electrodes. Here, the auxiliary electrode being electrically connected to the light emitting unit means that the auxiliary electrode overlaps with the first electrode in the light emitting unit. For example, the auxiliary electrode may overlap with a part of the first electrode; or, the auxiliary electrode may overlap with the entire first electrode, which is not specifically limited here.

The material of the auxiliary electrode is not specifically limited. For example, the material of the auxiliary electrode may be metal, and further may be reflective metal, such as silver (Ag), aluminum (Al), etc., Of course, the material of the auxiliary electrode may also be a composite material, such as IZO+reflective metal, etc. In the case that the material of the auxiliary electrode includes the reflective metal, the auxiliary electrode can also reflect light, thereby improving light utilization efficiency.

Optionally, the insulation portion covers all side surfaces of the light emitting unit; the auxiliary electrode is located on a side of the insulation portion facing away from the light emitting unit, and covers at least part of the second surface of the light emitting unit. Therefore, if a problem such as poor contact occurs between a certain auxiliary electrode and the first conductive part, the electrical connection between the first electrode and the first conductive portion in the light emitting unit will not be affected, and the function of transferring the Vcom signal to the light emitting unit through the first conductive portion can still be realized.

The auxiliary electrode covering at least part of the second surface of the light emitting unit means one of the following: the auxiliary electrode covers part of the second surface of the light emitting unit, and is in contact with part of the first electrode; or, the auxiliary electrode covers the entire second surface of the light emitting unit and is in contact with the entire first electrode, which is not specifically limited here. As an example, the insulation portion 36 covers only one side surface of the light emitting unit and the auxiliary electrode 37 covers part of the second surface of the light emitting unit in both FIG. 1 and FIG. 2.

Optionally, the light emitting unit includes a second electrode, an epitaxial wafer, and a first electrode successively stacked on the driving backplane, and the auxiliary electrode is electrically connected to the first electrode and at least covers part of the first electrode. Therefore, the first electrode can be electrically connected to the first conductive portion through the auxiliary electrode, so as to input the Vcom signal to the first electrode through the first conductive portion.

The above epitaxial wafer may include a hole injection layer, an emission layer and an electron injection layer stacked in sequence; or, the epitaxial wafer may include an electron injection layer, an emission layer and a hole injection layer stacked in sequence. As an example, the red epitaxial wafer includes a first hole injection layer 33, a first emission layer 34 and a first electron injection layer 35 stacked in sequence in both FIG. 1 and FIG. 2.

The emission layer is the light-emitting area of the epitaxial wafer where carriers are confined. The material of the emission layer is not specifically limited here. Exemplarily, the material of the emission layer may include multiple quantum wells.

The electron injection layer can be used to supply electrons, and can be used as the N region of the emission layer. The material of the electron injection layer is not specifically limited here. For example, the material of the electron injection layer may include any one of gallium nitride (GaN), gallium phosphide (GaP) or zinc oxide (ZnO).

The hole injection layer can be used to supply holes, and can be used as the P region of the emission layer. The material of the hole injection layer is not specifically limited here. For example, the material of the hole injection layer may include any one of gallium nitride (GaN), gallium phosphide (GaP) or zinc oxide (ZnO).

The emission layer may also include other film layers. For example, the emission layer includes an electron blocking layer arranged on a side of the emission layer facing away from the electron injection layer, which can be used to prevent electrons from leaking to the P region of the emission layer, thereby improving the recombination rate of electrons and holes in the light-emitting recombination region.

The auxiliary electrode covering at least a part of the first electrode means one of the following: the auxiliary electrode covers a part of the first electrode; or, the auxiliary electrode covers the entire first electrode, which is not specifically limited here.

Optionally, the light emitting device further includes a reflective layer disposed between the driving backplane and the second electrode. Thus, a light emitting device with a face-up structure is obtained. In this case, both electrodes are located on the light emitting side.

In an exemplary embodiment, the reflective layer may include an aluminum metal layer and a protective layer. The protective layer is located between the aluminum metal layer and the driving backplane. Both the aluminum metal layer and the protective layer have electrical conductivity, and the aluminum metal layer has a good reflective effect. Therefore, the light emitted from the emission layer toward the reflective layer can be reflected, thereby improving the light output rate of the light emitting panel, improving the use efficiency of light emitted by the emission layer, improving the display effect, and reducing the power consumption.

It should be noted that the reflective layer may be conductive, or the second electrode in the light emitting device may be made of a reflective material, that is, the second electrode is also configured to have a reflective function.

Optionally, the driving baseboard includes a first substrate provided with the plurality of first conductive parts and the plurality of driving units arranged in an array. The first substrate is a silicon substrate.

In an exemplary embodiment, the driving baseboard may include silicon elements, such as polysilicon or monocrystalline silicon, and the driving baseboard may also be referred to as a silicon substrate or a silicon-based backplane.

It should be noted that the driving unit provided by some embodiments of the present application can use silicon-based transistors, and is not necessary to compensate the threshold voltage. The structure of the driving unit is simple, the volume of a single silicon-based transistor is reduced, and the area of the driving unit can be greatly reduced, thereby greatly increasing the pixel density of the light emitting panel.

An embodiment of the present application also provides a light emitting apparatus, including the above light emitting panel.

In an exemplary embodiment, the light emitting apparatus may be used as a backlight apparatus or a display apparatus.

In an exemplary embodiment, the light emitting apparatus may be a Mini-LED light emitting apparatus; or, the light emitting apparatus may also be a Micro-LED light emitting apparatus.

In the embodiment of the present application, each second electrode of the light emitting apparatus is electrically connected to one driving unit, and the first electrodes are electrically connected to the first conductive portions; a junction where at least one first electrode is electrically connected to the first conductive portion is different from junctions where first electrodes other than the at least one first electrode are electrically connected to the first conductive portions other than said first conductive portion. In this way, on the one hand, since at least one first electrode is no longer electrically connected to other first electrodes, at least one first electrode can be independently controlled by the voltage on the first conductive portion, thereby effectively reducing the serious IR drop problem caused by the large square resistance of the first electrode if a transparent first electrode is used on the light emitting surface of the light emitting device. On the other hand, since at least one first electrode can be individually controlled by the voltage on the first conductive portion, that is, at least one first electrode can be independently patterned, the at least one first electrode can be dynamically adjusted and controlled independently to reduce the power consumption.

An embodiment of the present application further provides a method for preparing the above-mentioned light emitting panel.

The method includes steps described below.

At S1, a driving baseboard and a plurality of light emitting devices are formed.

The driving baseboard includes a plurality of first conductive portions and a plurality of driving units arranged in an array, and the first conductive portions are insulated from the driving units. The plurality of light emitting devices are arranged in an array on the driving baseboard. Each of the light emitting devices includes a first electrode and a second electrode, each second electrode is electrically connected to a driving unit, and the first electrode is electrically connected to the first conductive portion. A junction where at least one first electrode is electrically connected to the first conductive portion is different from junctions where first electrodes other than this first electrode are electrically connected to first conductive portions other than this first conductive portion.

The sequence of forming the driving baseboard and forming the plurality of light emitting devices is not specifically limited. For example, the driving baseboard can be formed first, and then the plurality of light emitting devices are formed; or, the driving baseboard and the plurality of light emitting devices can be formed at the same time; or, the plurality of light emitting devices can be formed first, and then the driving baseboard is formed.

It should be noted that the light emitting panel prepared by the preparation method provided in the embodiment of the present application may also include other structures and components. For the structures and components included in the light emitting panel, reference may be made to the description of the light emitting device in the previous embodiment, and details will not be repeated here.

By performing the above step S1, on the one hand, at least one first electrode can be independently controlled by the voltage on the first conductive portion, thereby effectively reducing the serious IR drop problem caused by the large resistance of the first electrode if a transparent first electrode is used on the light emitting surface of the light emitting device; on the other hand, since at least one first electrode can be individually controlled by the voltage on the first conductive portion, that is, at least one first electrode can be independently patterned, the at least one first electrode can be dynamically adjusted and controlled independently to reduce the power consumption.

Hereinafter, a preparation method of the light emitting device will be described in detail with reference to FIG. 1, FIG. 7 to FIG. 13.

Figure 7:
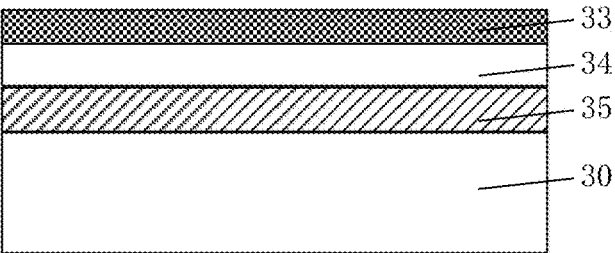
FIG. 7 to FIG. 13 are preparation process flow charts of the structure shown in FIG. 1 provided by embodiments of the present application.

At S21, referring to FIG. 7, an epitaxial wafer is grown on the second substrate 30.

The epitaxial wafer includes a first electron injection layer 35, an emission layer 34 and a first hole injection layer 33 that are stacked in sequence.

The material of the second substrate is not specifically limited here. For example, the material of the second substrate may include any one of silicon or silicon carbide.

Figure 8:
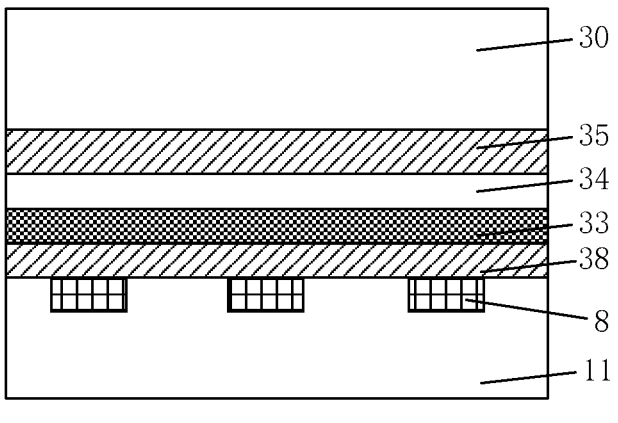

At S22, referring to FIG. 8, the epitaxial wafer is inverted, and the first hole injection layer 33 in the inverted epitaxial wafer is bonded to the bonding metal 38 on the driving baseboard through the second electrode 32.

The driving baseboard includes the first substrate 11 and the bonding metal 38 disposed on the first substrate.

Here, there is no specific limitation on the type of the driving baseboard. Exemplarily, the driving baseboard may be a CMOS backplane.

Here, there is no specific limitation on the bonding process. For example, the bonding process may adopt eutectic bonding or thermocompression bonding. Exemplarily, the bonding temperature may range from 100° C. to 400° C. Specifically, the bonding temperature may be 100° C., 200° C., 300° C. or 400° C.

Here, there is no specific limitation on the materials of the second electrode and the bonding metal. For example, the materials of the second electrode and the bonding metal may both include metals, such as copper (Cu), tin (Sn), silver (Ag), gold (Au), indium (In). A bonding such as Cu—Sn, Sn—Ag, Sn—In, Sn—Au, Au—In, Cu—In bonding may occur between the material of the second electrode and the material of the bonding metal. Among them, Cu—Sn means that if the material of the second electrode is Cu and the material of the bonding metal is Sn, the two can be bonded; or, if the material of the second electrode is Sn and the material of the bonding metal is Cu, the two can be bonded.

Figure 9:
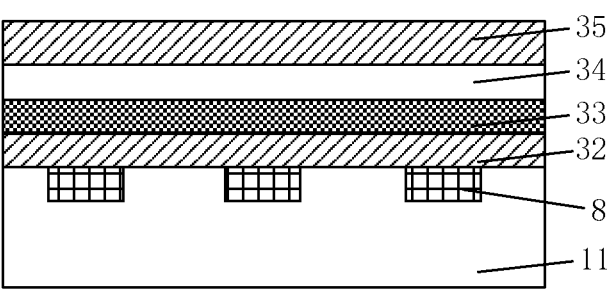

At S23, referring to FIG. 9, the second substrate 30 is removed.

In practical applications, the second substrate can be removed according to conditions. If the second substrate is a silicon substrate, it can be removed by a wet etching process or a dry etching process. For example, the light emitting device may be soaked in hydrofluoric acid (HF) to remove the second substrate.

It should be noted that the second substrate may not be removed, as long as the epitaxial wafer can be patterned.

Figure 10:
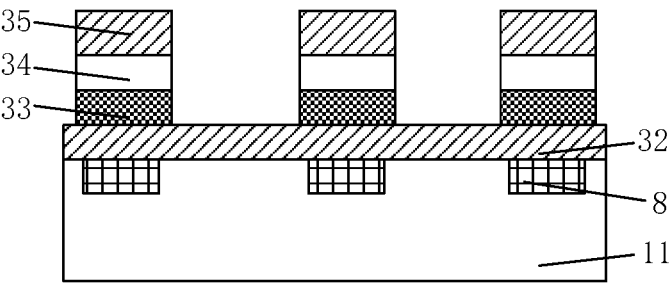

At S24, referring to FIG. 10, the epitaxial wafer is patterned to form a plurality of epitaxial wafers.

Here, there is no specific limitation on the patterning process. For example, the epitaxial wafer may be patterned by a dry etching process.

Figure 11:
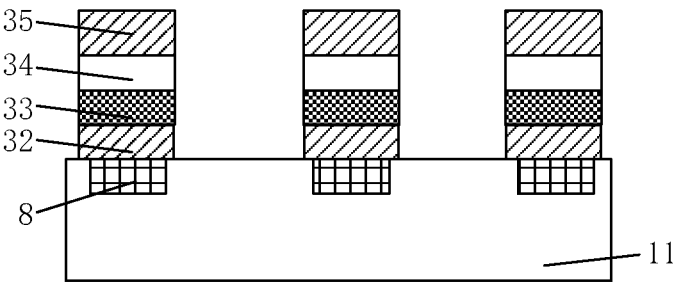

At S25, referring to FIG. 11, the bonding metal 38 is patterned to form a plurality of second electrodes 32.

Here, there is no specific limitation on the above-mentioned patterning process. For example, the second electrode may be patterned by a wet etching process or a dry etching process.

Figure 12:
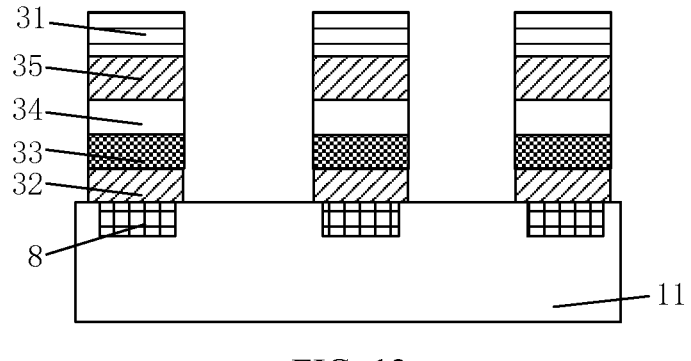

At S26, referring to FIG. 12, a first electrode 31 is formed on each epitaxial wafer.

The material of the first electrode is not specifically limited here. For example, the material of the first electrode may include metal, etc., for example, ITO (Indium Tin Oxides), chromium/platinum/gold, titanium/gold, titanium/silver/indium tin oxide (Ti/Ag/ITO) and the like.

Figure 13:
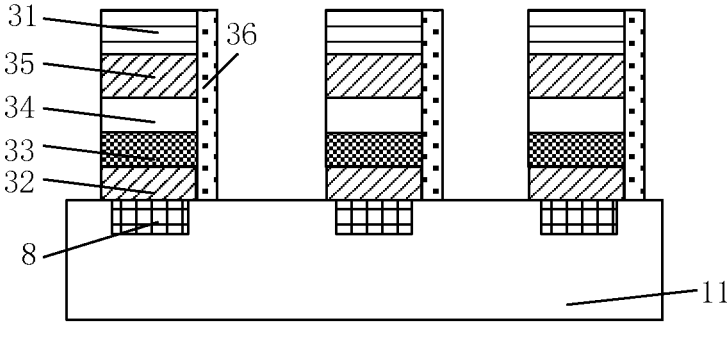

At S27, referring to FIG. 13, an insulation portion 36 is formed on one side surface of each light emitting unit.

There is no specific limitation on the material of the insulation portion. For example, the material of the insulation portion may be any one of silicon nitride, silicon oxide, or silicon oxynitride, or a combination thereof.

Of course, all side surfaces of each light emitting unit may be formed with the insulation portion.

At S28, referring to FIG. 1, an auxiliary electrode 37 is formed on a side of the insulation portion 36 in each light emitting unit facing away from the light emitting unit.

The material of the auxiliary electrode is not specifically limited herein. For example, the material of the auxiliary electrode may be metal, and further may be reflective metal, such as silver (Ag), aluminum (Al), etc., of course, may also be a composite material, such as IZO+reflective metal, etc.

Of course, the auxiliary electrode may also be provided on the side of the insulation portions, located on all side surfaces of the light emitting unit, facing away from the light emitting unit.

It should be noted that the bonding process of the light emitting device is described here by taking the light emitting device including three light emitting units as an example. For a situation where the light emitting device includes different numbers of light emitting units, the bonding process is similar to the above, and will not be repeated here.

The colors of light emitted by the three light emitting units formed here are consistent. If the light emitted by the light emitting units has different colors, for example, when the emission layer is a blue light emitting layer, one of the light emitting units is not changed in terms of structures, and a quantum dot layer is added in the other two light emitting units. For example, the quantum dot layer is disposed on a side of the first electrode facing away from the second electrode, in this case, the other two light emitting units can emit red light and green light respectively.

Moreover, the embodiments of the present application only introduce the bonding process of the light emitting units in the light emitting device related to the creative idea of the application. The preparation methods of other film layers and components included in the light emitting device can refer to related technologies, and will not be repeated here.

In the description provided herein, numerous specific details are set forth. However, it is understood that embodiments of the present disclosure may be practiced without these specific details. In some instances, common methods, structures and techniques have not been shown in detail in order not to obscure the understanding of this description.

Finally, it should be noted that the above embodiments are only used for illustrating, rather than limiting, the technical solutions of the present disclosure. Although the present disclosure has been described in detail with reference to the aforementioned embodiments, those skilled in the art should understand that, the technical solutions described in the aforementioned embodiments may still be modified, or an equivalent replacement may be performed on some of the technical features. These modifications or replacements do not make the essence of the corresponding technical solutions departing from the spirit and scope of the technical solutions of the embodiments of the present disclosure.

The invention claimed is:

1. A light emitting panel, comprising:
a driving baseboard, comprising a plurality of first conductive portions and a plurality of driving units arranged in an array, wherein the first conductive portions are insulated from the driving units;
a plurality of light emitting devices arranged on the driving baseboard in an array, wherein each of the light emitting devices comprises a first electrode and a second electrode, the second electrode being electrically connected to one of the driving units, and the first electrode being electrically connected to the first conductive portion; and
a junction where at least one first electrode is electrically connected to the first conductive portion is different from junctions where first electrodes other than said first electrode are electrically connected to first conductive portions other than said first conductive portion,
wherein the light emitting device comprises a light emitting unit, the light emitting unit comprises a side surface, a first surface and a second surface opposite to each other, the first surface and the second surface are connected to the side surface respectively, and the second surface is located on a side of the light emitting unit facing away from the driving baseboard, and
wherein the light emitting device further comprises an insulation portion and an auxiliary electrode, the insulating portion covers at least one side surface of the light emitting unit, the auxiliary electrode is at least located on a side of the insulation portion facing away from the light emitting unit, and is electrically connected to the light emitting unit.

2. The light emitting panel according to claim 1, wherein all first electrodes are divided into multiple groups, each of the groups comprises at least one first electrode, and the groups are electrically connected to different first conductive portions respectively.

3. The light emitting panel according to claim 2, wherein each of the groups comprises one of the first electrodes, and each of the first electrodes is electrically connected to one of the first conductive portions.

4. The light emitting panel according to claim 2, wherein each of the groups comprises multiple first electrodes, and in each of the groups, at least one of the first electrodes is electrically connected to a different first conductive portion.

5. The light emitting panel according to claim 4, wherein, in each of the groups, all of the first electrodes are electrically connected to one of the first conductive portions.

6. The light emitting panel according to claim 2, wherein each group comprises at least three light emitting devices of different colors, and the light emitting devices of different colors are electrically connected to different first conductive portions respectively.

7. The light emitting panel according to claim 6, comprising at least red light emitting devices, blue light emitting devices and green light emitting devices, wherein the red light emitting devices are electrically connected to one of the first conductive portions, the green light emitting devices are electrically connected to one of the first conductive portions, and the blue light emitting devices are electrically connected to one of the first conductive portions.

8. The light emitting panel according to claim 1, wherein the driving baseboard further comprises a second conductive portion disposed between the light emitting device and the driving unit, the light emitting device is electrically connected to the driving unit through the second conductive portion; the second conductive portion is insulated from the first conductive portion;
wherein at least one of the plurality of first conductive portions is arranged in a same layer as the second conductive portion.

9. The light emitting panel according to claim 8, wherein, in the case that at least one of the plurality of first conductive portions is arranged in the same layer as the second conductive portion, all the first conductive portions are arranged in the same layer as the second conductive portion.

10. The light emitting panel according to claim 1, wherein the insulation portion covers all side surfaces of the light emitting unit;
the auxiliary electrode is located on the side of the insulation portion facing away from the light emitting unit, and covers at least part of the second surface of the light emitting unit.

11. The light emitting panel according to claim 10, wherein the light emitting unit comprises the second electrode, an epitaxial wafer, and the first electrode successively stacked on the driving baseboard, the auxiliary electrode is electrically connected to the first electrode, and covers at least a part of the first electrode.

12. The light emitting panel according to claim 10, wherein the light emitting device further comprises a reflective layer disposed between the driving baseboard and the second electrode.

13. The light emitting panel according to claim 1, wherein the driving baseboard comprises a first substrate, and the plurality of first conductive portions and the plurality of driving units arranged in an array are all disposed on the first substrate;
the first substrate is a silicon substrate.

14. A light emitting apparatus comprising a light emitting panel, wherein the light emitting panel comprises:

a driving baseboard, comprising a plurality of first conductive portions and a plurality of driving units arranged in an array, wherein the first conductive portions are insulated from the driving units;

a plurality of light emitting devices arranged on the driving baseboard in an array, wherein each of the light emitting devices comprises a first electrode and a second electrode, the second electrode being electrically connected to one of the driving units, and the first electrode being electrically connected to the first conductive portion; and a junction where at least one first electrode is electrically connected to the first conductive portion is different from junctions where first electrodes other than said first electrode are electrically connected to first conductive portions other than said first conductive portion, wherein the light emitting device comprises a light emitting unit, the light emitting unit comprises a side surface, a first surface and a second surface opposite to each other, the first surface and the second surface are connected to the side surface respectively, and the second surface is located on a side of the light emitting unit facing away from the driving baseboard, and wherein the light emitting device further comprises an insulation portion and an auxiliary electrode, the insulating portion covers at least one side surface of the light emitting unit, the auxiliary electrode is at least located on a side of the insulation portion facing away from the light emitting unit, and is electrically connected to the light emitting unit.

15. A method for preparing a light emitting panel, comprising forming a driving baseboard and a plurality of light emitting devices, wherein the driving baseboard comprises a plurality of first conductive portions and a plurality of driving units arranged in an array, and the first conductive portions are insulated from the driving units, wherein the plurality of light emitting devices are arranged on the driving baseboard in an array, wherein each of the light emitting devices comprises a first electrode and a second electrode, the second electrode being electrically connected to one of the driving units, and the first electrode being electrically connected to the first conductive portion, wherein a junction where at least one first electrode is electrically connected to the first conductive portion is different from junctions where first electrodes other than said first electrode are electrically connected to first conductive portions other than said first conductive portion, wherein the light emitting device comprises a light emitting unit, the light emitting unit comprises a side surface, a first surface and a second surface opposite to each other, the first surface and the second surface are connected to the side surface respectively, and the second surface is located on a side of the light emitting unit facing away from the driving baseboard, and wherein the light emitting device further comprises an insulation portion and an auxiliary electrode, the insulating portion covers at least one side surface of the light emitting unit, the auxiliary electrode is at least located on a side of the insulation portion facing away from the light emitting unit, and is electrically connected to the light emitting unit.

16. The light emitting panel according to claim 1, wherein at least one of the plurality of first conductive portions is arranged in the same layer as the driving units.

* * * * *